United States Patent
Franke et al.

(10) Patent No.: US 11,415,618 B2
(45) Date of Patent: Aug. 16, 2022

(54) METHOD AND TESTING DEVICE

(71) Applicant: Lisa Dräxlmaier GmbH, Vilsbiburg (DE)

(72) Inventors: Michael Franke, Geisenhausen (DE); Andreas Kappl, Landshut (DE)

(*) Notice: Subject to any disclaimer, the term of this patent is extended or adjusted under 35 U.S.C. 154(b) by 0 days.

(21) Appl. No.: 17/429,036

(22) PCT Filed: Feb. 6, 2019

(86) PCT No.: PCT/EP2019/052845
§ 371 (c)(1),
(2) Date: Aug. 6, 2021

(87) PCT Pub. No.: WO2020/160761
PCT Pub. Date: Aug. 13, 2020

(65) Prior Publication Data
US 2022/0137119 A1    May 5, 2022

(51) Int. Cl.
*G01R 31/08* (2020.01)
*G01R 31/52* (2020.01)
(Continued)

(52) U.S. Cl.
CPC .......... *G01R 31/086* (2013.01); *G01R 31/088* (2013.01); *G01R 31/52* (2020.01); *B60R 16/0207* (2013.01); *G01R 31/007* (2013.01)

(58) Field of Classification Search
CPC .... G01R 31/086; G01R 31/088; G01R 31/52; G01R 31/007; B60R 16/0207
(Continued)

(56) References Cited

U.S. PATENT DOCUMENTS

2015/0081599 A1* 3/2015 Dobler ................. G01R 31/00
706/12

FOREIGN PATENT DOCUMENTS

| CN | 107766879 A | 3/2018 |
|---|---|---|
| DE | 102017110620 A1 | 11/2018 |

OTHER PUBLICATIONS

Translation of PCT/EP2019/052845 International Search Report.
(Continued)

*Primary Examiner* — Farhana A Hoque
(74) *Attorney, Agent, or Firm* — Jacob Eisenberg

(57) ABSTRACT

A method for testing a network is disclosed, the network having a number of network sections, in particular in a cable harness having a number of such networks, having the following steps of: recording training measured values for a number of reference networks, wherein the reference networks correspond to the network to be tested, preprocessing the recorded training measured values in order to eliminate data errors in the training measured values, training a first classification system using the training measured values, wherein the first classification system is based on at least one algorithm from the field of machine learning and is designed to classify a network either as fault-free or faulty, training a second classification system using the training measured values, wherein the second classification system is based on at least one algorithm from the field of machine learning and is designed to classify a faulty network section of a network, recording test measured values for the network to be tested, preprocessing the recorded test measured values in order to eliminate data errors in the training measured values, classifying the network to be tested as fault-free or faulty on the basis of the recorded test measured values using the trained first classification system, and classifying the faulty network section of the network to be tested using the trained second classification system if the network (to be tested was classified as faulty by the trained first classification system. The present invention also discloses a corresponding testing device.

15 Claims, 4 Drawing Sheets

(51) Int. Cl.
*B60R 16/02* (2006.01)
*G01R 31/00* (2006.01)

(58) Field of Classification Search
USPC ............................................ 324/512
See application file for complete search history.

(56) References Cited

OTHER PUBLICATIONS

Translation of PCT/EP2019/052845 International Preliminary Examination Report.
English Abstract for CN107766879A, Mar. 6, 2018.
English Abstract for DE102017110620A1, Nov. 22, 2018.
PCT/EP2019/052845 International Search Report in German.

* cited by examiner

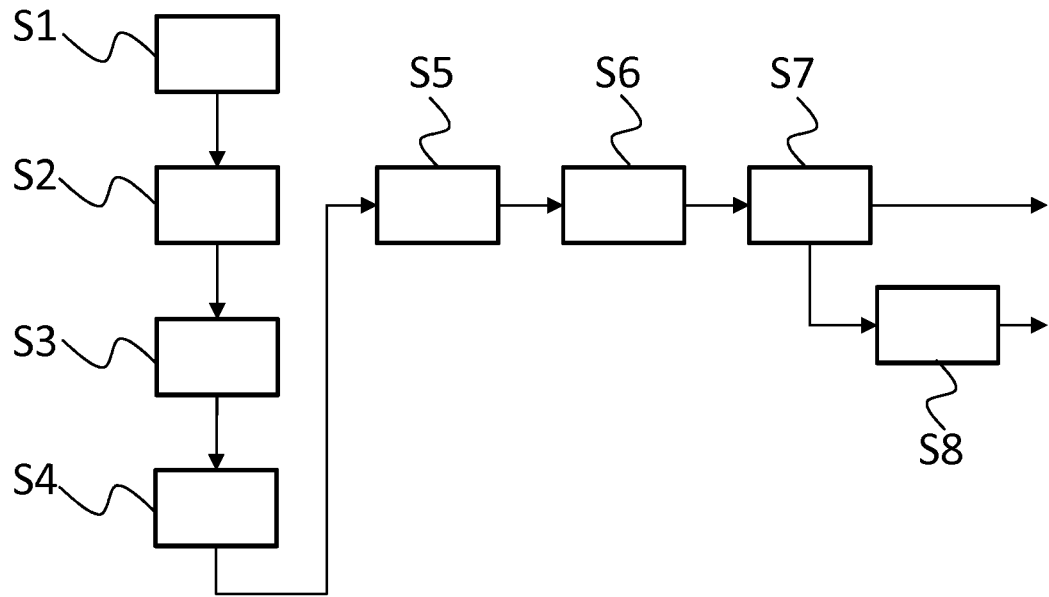
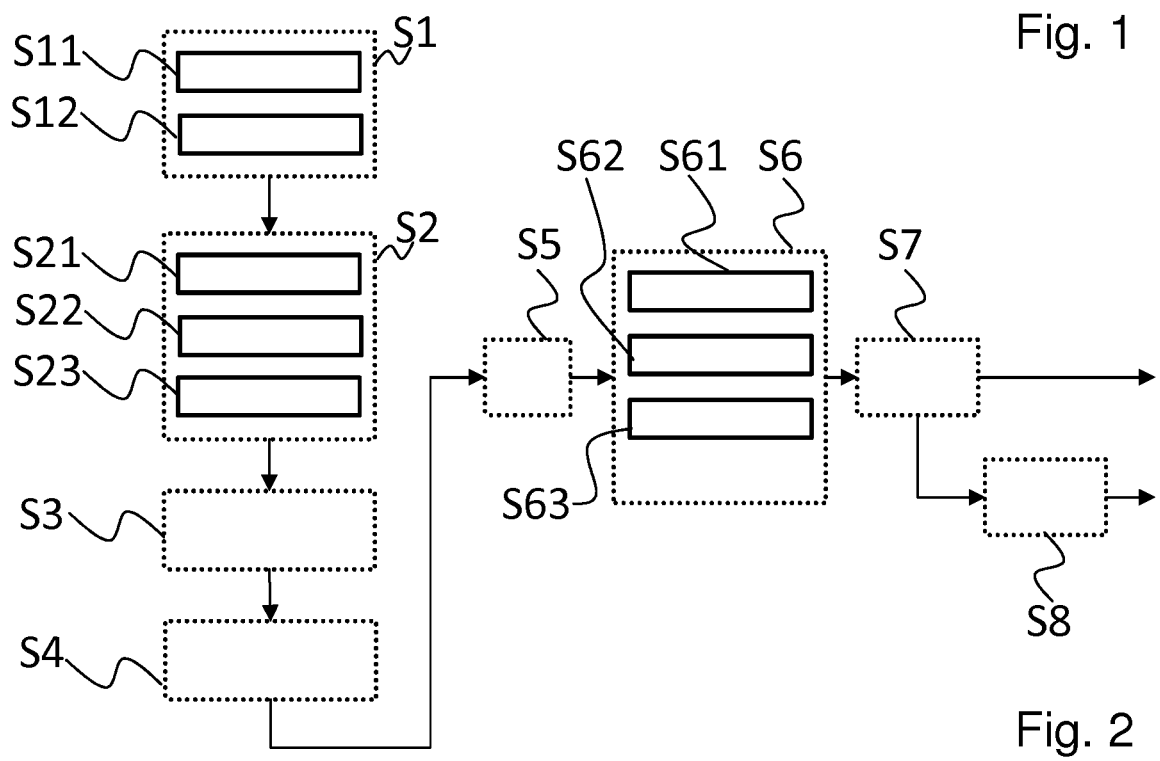
Fig. 1
Fig. 2

METHOD AND TESTING DEVICE

CROSS REFERENCE TO RELATED APPLICATIONS

This application is a national phase of International Application No.: PCT/EP2019/052845 A2, filed on 6 Feb. 2019, the contents of which are expressly incorporated herein by reference to their entireties.

BACKGROUND OF THE INVENTION

The present invention relates to a testing device for testing a line set. The invention further relates to a corresponding method.

The present invention will be described below primarily in connection with vehicle electrical systems. It is understood that the present invention may also be used with other electrical networks.

A large number of electrical and electronic components are installed in modern vehicles. Such components can be, for example, control units that provide comfort functions or driver assistance functions. A large number of such control units can be installed in a modern vehicle. The control units are usually electrically connected to each other via a set of cables. Such a wiring harness or cable set can have different electrical networks with supply lines and data lines.

To ensure that the subsequent vehicle functions properly, the cable sets must be tested. Particularly in the case of data lines or networks of data lines and other components, it is increasingly important to test their properties at high frequencies. In addition to pure presence or continuity testing, quality criteria such as impedance as a function of location and S-parameters can also be tested.

For single lines, for example, the locally resolved impedance curve can be detected and evaluated. However, this method cannot be used efficiently for networks consisting of several connected data lines and possibly also other electrical or electronic components. In such networks, a large number of reflections are superimposed, which means that individual fault points in the detected measurement curve cannot be identified directly and unambiguously.

BRIEF SUMMARY OF THE INVENTION

One task of the invention is therefore to make it possible to test complex line networks using means that are as simple as possible in terms of design.

The task is solved by the objects of the independent claims. Advantageous further embodiments of the invention are indicated in the dependent claims, the description and the accompanying figures. In particular, the independent claims of one claim category may also be further developed analogously to the dependent claims of another claim category.

A method according to the invention is used for testing a network comprising a number, i.e. one or more, of network sections, in particular in a line set comprising a number, i.e. one or more, of such networks. The method consists of the following steps: taking training measurements for a number, i.e. one or more, of reference networks, the reference networks corresponding to the network to be tested, preprocessing the taken training measurements to eliminate data errors in the training measurements, training a first classification system with the training measurements, wherein the first classification system is based on at least one algorithm from the field of machine learning and is adapted to classify a network as either faulty-free or faulty, training a second classification system with the training measurements, wherein the second classification system is based on at least one algorithm from the field of machine learning and is adapted to classify a network as either faulty-free or faulty, classifying an erroneous network section of a network, recording test measured values for the network to be tested, preprocessing the recorded test measured values to eliminate data errors in the training measured values, classifying the network to be tested as faulty-free or faulty on the basis of the recorded test measured values with the trained first classification system, and classifying the faulty network section of the network to be tested with the trained second classification system if the network to be tested has been classified as faulty by the trained first classification system.

A testing device according to the invention is used for testing a network comprising a number, i.e. one or more, of network sections, in particular in a line set comprising a number, i.e. one or more, of such networks. The testing device comprises: a first data acquisition means adapted to acquire training measurements for a number, i.e. one or more, of reference networks, said reference networks corresponding to the network to be tested, a computing means adapted to preprocess the acquired training measurements for eliminating data errors in the training measured values, a first classification system, which is based on at least one algorithm from the field of machine learning and is designed to classify a network as either faulty-free or faulty, the computing device being further designed to train the first classification system using the training measured values, a second classification system which is based on at least one algorithm from the field of machine learning and is designed to classify an error-ridden network portion of a network wherein the computing means is further adapted to train the second classification system with the training measured values, a second data acquisition means adapted to record test measured values for the network to be tested, comprising a test control means adapted to preprocess the recorded test measured values for eliminating data errors in the training measured values, the test control means being further adapted to classifying the network to be tested as faulty-free or faulty on the basis of the recorded test measured values using the trained first classification system, and wherein the test control means is further adapted to classify the faulty network section of the network to be tested using the trained second classification system when the network to be tested has been classified as faulty by the trained first classification system.

The present invention is based on the realization that it is not possible to effectively test complex networks in wire sets using conventional methods.

In modern vehicles, for example, high-frequency data lines are increasingly being used in electrical networks that do not merely establish a point-to-point connection. Such electrical networks may also have, for example, a bus structure with stubs or a star structure with a central node.

In principle, the exchange of information between electronic control units has literally exploded in recent years. The number of control units has increased, and the additional networking required for new types of services has increased complexity. Due to various reasons, wireless transmissions have not yet found their way into the onboard network: Numerous shielding metal structures within the vehicle, anticipated problems in the area of electromagnetic compatibility, or the potential dangers of electro smog that are often discussed these days. For this reason, it is all the more important that the cable-based high-frequency data transmissions are as interference-free and reliable as possible. Two of the possible cable types are the coaxial cable and the UTP (Unshielded Twisted Pair) cable.

Coaxial cables consist of a solid inner conductor made of copper, an insulating dielectric (electrically non-conductive substance), a shield that simultaneously acts as a return conductor, and a sprayed on sheath that protects the cable from external influences. Due to its shielding design, the coaxial cable has favorable transmission properties for the high-frequency range, but is relatively complex and therefore expensive to manufacture. For this reason, in many cases UTP cables are used, cables with twisted pairs of wires without explicit shielding. These are inexpensive to manufacture and also have two decisive advantages. Although the design does not provide shielding, it has a high immunity to interference. The signals on the two lines are inverted with respect to each other; external interference, on the other hand, affects both lines equally. This means that there is differential signal transmission. As a result, the amplitude of the inverted signal doubles and the interference signals are eliminated in the receiver by subtraction.

However, previous methods of optical testing of a measurement curve for a data line, for example, cannot be used for complex networks. In more complex networks of UTP lines, the overlapping of a large number of reflections in the measurement leads in particular to the fact that characteristic curve features cannot be identified individually and located in the network.

However, the higher the data transmission rates required for modern applications such as autonomous driving, the more important it is for networks to be compliant in order to ensure faulty-free data transmission.

Accordingly, the present invention provides an opportunity to test electrical networks using methods or algorithms from the field of machine learning.

Training measured values for one or more reference networks are recorded for this purpose. The term "reference network" refers to a network whose property has already been checked for conformity, which is therefore in a defined state, for example, is faulty-free. It is understood that this test can be carried out, for example, in advance of the recording of training data. Since this is a one-time test of the reference networks for each of the networks to be tested, more complex procedures can be used for this purpose, for example also under laboratory conditions. The actual testing of the networks to be tested, for example in a series production, can then be carried out very efficiently with the aid of the present invention.

For example, the time domain reflectometry can be used to record the training measured values as well as the subsequent recording of the test measured values. It is understood that any other appropriate suitable method can also be used. In time domain reflectometry, voltage curves are measured over time and their progressions are used as a basis for analysis.

In principle, the time domain reflectometry attempts to detect errors along the network used based on the corresponding voltage curves. Voltages and reflections fed in along the network are reflected in the voltage curves due to impedance changes.

In the case of twisted cables with one open end, the resistance is infinite. For the voltage reflection factor, a limit value calculation results in the value 1, the complete positive reflection. In the case of a short circuit, the resistance is almost 0, resulting in a factor of −1, the complete negative reflection. If the termination impedance deviates from the special cases just mentioned, partial reflections are detectable. The same effect occurs when the impedance changes along the line and is not constant throughout. Changes occur, for example, when twists come loose, the insulations are damaged, the structure itself has not been produced constantly, or even the cable has been kinked or torn off. To perform time domain reflectometry, a voltage level is applied to an input of the network and propagates along the network. Depending on how the line ends are terminated or impedances change along the network, different reflections occur, which are recorded at the point of feeding using an oscilloscope. This characteristic voltage curve (sum of the outgoing and incoming voltage) that arises for the line network allows conclusions to be drawn about its nature. This voltage curve and the corresponding training and test measurement data are also referred to as the electrical fingerprint.

The present invention provides for training a first classification system and a second classification system using the training data.

However, an essential aspect of the present invention lies in the preprocessing of the recorded training measured values. The recording of the training measured values provides an electrical fingerprint in raw form for each of the reference networks, i.e., the unchanged training measured values.

In the design of the present invention, however, it was determined that the unchanged training measured values can have insufficient data quality or must be adjusted or corrected accordingly. According to the invention, said cleaning or correction is carried out in the step of preprocessing the recorded data.

Possible errors or problems in the recorded training measured values can be, for example: an offset between individual measurement series or individual measurement curves of a measurement series, conspicuously deviating measurement curves within a measurement series, measurement curves with strong vibrations, total measurement errors or signal interference.

After the preprocessing of the recorded training measured values, a first classification system and a second classification system are trained with the preprocessed training measured values.

It would be possible to train a single classification system that recognizes whether a network is faulty-free (OK) or not (NOK), and in case of faulty networks, recognizes which section of the network is affected. However, related studies have shown that simultaneous OK/NOK qualification with fault localization is difficult to perform using machine learning methods.

The present invention therefore provides for a two-stage test. Examination of the present invention has shown that a defective or faulty network can be detected with a high degree of certainty by the first classification system. Furthermore, it has been shown that a correspondingly trained second classification system, which is only trained to recognize the fault location or position in networks that have already been classified as defective, can also recognize this defect location or position with very high accuracy. In this two-stage analysis or testing of the networks, faulty networks can therefore be detected with very high accuracy and the fault can be localized at the same time.

Thus, if the first classification system detects a fault-free network, the corresponding test measured values are not fed to the second classification system. If, however, the first classification system classifies the network as faulty, the corresponding test measured values are fed to the second classification system. Since it is already known that the test measured values originate from a faulty network, the second classification system is designed to classify the network section that contains the defect.

The term "network section" refers to sections in the network that are identified by their position and/or length. Furthermore, the term "network section" can also be understood to mean a delimited section of a network, for example a spur line on a bus or a section of the main line of the bus between two spur lines. For example, in a network with a star structure, any branch branching off from the central node or star coupler can be considered a section.

The method according to the present invention may be implemented, for example, in a corresponding test apparatus. In such a test apparatus, the first data acquisition device and the second data acquisition device may be, for example, the same data acquisition device. Similarly, the computing device and the test control device may be provided in a single computing unit. For example, a computer may be provided that executes corresponding programs for preprocessing the training measured values and test measured values and for training the classification systems and classifying the networks. For this purpose, corresponding programs or program instructions can be provided in a memory and loaded and executed by a processor coupled to the memory. The computer can, for example, also have corresponding measuring interfaces or be coupled to corresponding measuring devices.

It is understood that the testing device can be provided, for example, as a distributed system. In such a distributed system, for example, the acquisition of the training measured values and the training of the classification systems can be performed independently of a subsequent testing of networks, for example, in the production of line sets.

In such an embodiment, the first data acquisition device and the computing device can be provided, for example, in a laboratory or the like. However, the first data acquisition device and the computing device may also be provided directly at the production facility, for example only temporarily until after the classification systems have been trained. The second data acquisition device and the test control device can be provided directly at the production plant and used during the production of the networks or line sets for testing them.

Alternatively, the computing device and/or the test control device can also be provided on a central server, for example, which executes corresponding programs.

For the acquisition of the training measurement data and/or the test measurement data, corresponding measuring devices or systems can then be provided, which can be coupled to the central server.

The present invention makes it possible to identify faults in complex electrical networks very efficiently, in particular for high-frequency data transmission. It is not only possible to detect the presence of a fault. Rather, it is also possible to detect the position of the fault in the network or to narrow it down to a network section.

Further embodiments and further developments result from the sub-claims as well as from the description with reference to the figures.

In one embodiment, the recording of training measured values may comprise the recording of measured values on faulty-free reference networks. Furthermore, the recording of training measured values may also comprise recording measured values on reference networks in which errors have been generated at predetermined network sections.

Appropriate training data must be provided for training the classification systems. Consequently, for the classification of networks, for example in line sets, training data representing the classes to be recognized must be acquired and provided.

For the first classification system, training values must therefore be recorded in a fault-free network in order to enable an OK classification (fault-free). The first classification system can be trained to automatically classify all networks that are not classified as OK as NOK (not faulty-free). Alternatively, corresponding training values can be recorded for classification as NOK in order to train the first classification system.

As explained above, the first classification system is used to distinguish between fault-free (OK) and faulty (NOK) networks only. The second classification system, on the other hand, is used to localize the fault in networks detected as faulty. Localization means that the second classification system provides an indication or classification that allows the section of the network in which the fault is located to be determined.

Consequently, the training data or the corresponding training measured values must represent the corresponding errors. If a network with a bus topology (for example, a central line with spurs to the bus nodes) has, for example, 10 segments or network sections, training measured values must be recorded for each fault.

In a second step, therefore, an error is generated in each of the network sections one after the other in order to record the training measured values and corresponding training measured data is recorded.

For a network with 10 network sections, 10 measurement series are therefore carried out, one measurement series for each of the network sections with a corresponding error.

As explained above, time domain reflectometry is used to record a voltage curve for a network. The voltage curve is significantly influenced by impedance changes in the network. Consequently, an error generated in the corresponding network section can be understood as, for example, a deliberately caused impedance change.

It is understood that when recording the training measured values, a large number of measurements can be performed directly one after the other. The running times of the measurement signals on the lines are approx. 100 cm/ns. With today's usual line lengths of several meters, a measurement can thus be completed in the range of a few nanoseconds.

The corresponding data acquisition device can therefore carry out a large number of measurements in a few seconds. This makes it very easy to generate a large amount of training data, for example several thousand measurements for each measurement task.

In a further embodiment, to generate the faults in the corresponding network sections, the dielectric constant can be changed around a corresponding line of the respective network.

If the dielectric constant is changed around the line, the impedance of the line also changes at this point. As explained above, the impedance change leads to a reflection, which is reflected in the respective measurement.

The dielectric constant around the line can be achieved, for example, by gripping the line by hand. Such a change in the dielectric constant leads to a change in the impedance of the line, which corresponds to a deflection in the order of a few millimeters. Since the measurements can be carried out very quickly, gripping the line by hand is a very simple way to generate the faults or errors and to measure a network. In particular, the faults can be generated very easily in the different network sections.

It is understood that a device for accommodating the lines of a network or line set can also be provided, which can arrange corresponding elements around the lines in a controlled manner, which change the dielectric constant accordingly. This enables fully automated generation of fault points or faults in the corresponding network.

In a further embodiment, the preprocessing of the recorded training measured values can comprise recognizing and eliminating outliers in the recorded training measured values. Additionally, or alternatively, the preprocessing of the recorded test measured values may include recognizing and eliminating outliers in the recorded test measured values.

Different measurement errors can influence the measurement when recording training and test values. Possible errors can be, for example: missing values, inconsistent and incorrect data, redundancies in the form of multiple records, outliers, missing entire data sets.

Missing values cause incomplete data and thus do not represent the entire reality in the data set. Inconsistent and incorrect data, for example, can arise very quickly by shifting the decimal place. Such values can, for example, also be outside the valid value range. The causes are manifold: When integrating multiple data sources, for example, unequal spellings, abbreviations and standards used differently (units, formats) occur Redundancies in the form of data records that occur more than once are problematic because they shift the weighting in favor of the more frequently occurring data record and are thus considered more by the algorithms and used for pattern recognition than the others. Outliers often falsify the analysis result significantly. If entire data sets are missing, some possibly important objects may also be missing completely and thus not be used for the analyses.

It has been shown that with a proper planning of the data collection, that is, the measurement or recording of the training measured values and the test measured values, the effort for data cleaning can be significantly reduced. In this case, few of the typical data errors are present in the data. With appropriate care, missing, redundant or incorrect data can be avoided in advance.

In particular outliers due to measurement errors and disturbances within the individual measurement series have to be eliminated.

In one embodiment, the recognition of outliers can comprise recognizing and treating local outliers or global outliers.

Outliers in the form of individual data, which differ greatly from the others, belong to the random errors. Local outliers, which remain in the valid and plausible range of values but no longer follow the trend, are often difficult to detect. However, global outliers that differ significantly from the remaining values, are relatively easy to identify.

If an outlier is detected in a single measurement, for example a voltage curve acquired by time domain reflectometry, it must be treated accordingly.

Once data errors, i.e., outliers, have been identified as such, they can be treated in different ways. Possible corrections or treatments include:

Keep errors in the dataset, but mark them clearly so that they can be taken into account during further use Replace invalid data with defined error values, which are also recognized as such in retrospect Correction of incorrect value and estimation of missing value for individual objects with several options:
  Statistical measures such as arithmetic mean, median, minimum or maximum.
  Adoption of the value of the nearest neighbor, which can be determined by means of similarity measures
  Linear interpolation for time series, if individual values within the series are missing, also including non-linear interpolations when applied to splines
  Model-based estimation by regression or other prediction types in the field of machine learning
  Filtering of the signals, whereby outliers and many data errors are automatically detected and removed at the same time
  Removal of entire features or entire data sets with at least 1 faulty feature In the present invention—as explained above—a plurality of measurement series (also referred to above as features or data set) can be generated very simply. As a result, there is usually enough data available to remove incorrect data sets. In particular, this also prevents the information contained in the measurement series from being changed.

In another embodiment, the detection of outliers can be performed by means of the 2-sigma rule or by means of the Grubbs and Hampel outlier test or by means of the "Local Outlier Factor" algorithm.

With the 2-sigma rule, outliers are declared as such if they are at least two standard deviations from the mean of the distribution. To reduce the probability of error, the distance can also be increased to three standard deviations. To apply the 2-sigma rule, a normal distribution of the data is important. This can be ensured in advance by a suitable test.

The Grupps outlier testis an iterative method in which the outlier with the highest distance to the arithmetic means is detected one after the other until no more outliers occur. The Hampel outlier test optimized the test for Grubbs by using the median m instead of the arithmetic mean and the median of the absolute deviations from the median—MAD ((Median Absolute Deviation) instead of the standard deviation. This makes the detection of outliers independent of the mean and the standard deviation, on which the outliers have enormous effects and thus distort them.

In a further embodiment, the preprocessing of the recorded training measured values can comprise recognizing and eliminating offset errors in the recorded training measured values. In addition, or alternatively, the preprocessing of the recorded test measured values may comprise detecting and eliminating offset errors in the recorded test measured values.

Systematic deviations between the measurement series in the form of offsets are another type of error that cannot always be eliminated by conscientious preparation of the measurement. Reliably identifying offset errors and eliminating them with suitable methods of data cleaning can therefore significantly facilitate the training of classification systems or improve the classification results.

In another embodiment, the recognition and elimination of offset errors may comprise converting the recorded training measured values into differential measured values. Additionally, or alternatively, detecting and eliminating offset errors may comprise converting the recorded test measured values into differential measurement values.

The term differential measurement value means that the value of a measured value in a series of measurements indicates the distance to the previous value. The first value of each measurement series can, for example, be assumed to be a predefined value, in particular 0.

To illustrate this, the measurement series with the absolute values 3, 6, 7, 9, 3 is converted into a differential measurement series. The result of the conversion is then 0, 3, 1, 2, −6.

The representation of the measured values as differential measured values or differential measurement series automatically eliminates the offset and is very easy to perform.

In one embodiment, only an area of the measurement series can be cut out and subjected to recognition and elimination of the offset. In particular, this range can be selected, for example, starting with the feed-in of the measurement signal, for example a voltage stage. This avoids that measured values with 0 V are considered as part of the measurement before the actual measurement begins. These areas can then be used for the further course of the examination.

In one embodiment, the preprocessing of the recorded training measured values may comprise aggregating a plurality, in particular 2, 4, 8, 16, 32 or 64, of individual measurement curves in each case. Additionally, or alternatively, the preprocessing of the recorded test measured values may comprise aggregating a plurality of individual measurement curves, in particular 2, 4, 8, 16, 32 or 64.

The preprocessing of the recorded training data and the preprocessing of the recorded test data can also have a so-called "feature engineering". Feature engineering describes a process to generate features that allow an algorithm of machine learning to make good predictions. For this purpose, existing features, such as measured values, are combined or transformed according to the invention so that new helpful information is produced.

A basic form of feature engineering, for example, is data reduction, in which a very extensive data set is reduced. A second form of feature engineering is data transformation.

Possible concrete implementations may, for example, have normalization and scaling. Furthermore, for test measured values, for example, their differences from a reference measurement curve can be specified. The reference measurement curve can be provided, for example, as an average of all training measured values in a fault-free case. Furthermore, a Fourier transformation, for example a Fast Fourier transformation, can be applied to the measured values. A further possibility is to apply a binning on the timeline, whereby n consecutive data points are replaced by their mean value.

As explained above, an aggregation of measurement curves can also be performed. For the task of testing networks, the aggregation of measurement curves has proved to be particularly advantageous. In order to aggregate measurement curves, the arithmetic mean value is formed for the individual measurement points or measurement values of the measurement curves. A different number of measurement curves can be aggregated. In particular, for example, 16 measurement curves can be aggregated, which has proved to be particularly advantageous for the error rate of the classification systems.

In a further embodiment, the first classification system may be used on a decision tree algorithm or an algorithm according to the ensemble method, in particular an AdaBoost algorithm, or an algorithm for logistic regression or a Naive Bayes classifier algorithm or a K-nearest-neighbor classifier algorithm or a support vector machine algorithm. Additionally, or alternatively, the second classification system may be based on a decision tree algorithm or an algorithm according to the ensemble method, in particular an AdaBoost algorithm, or an algorithm for logistic regression or a Naive Bayes classifier algorithm or a K-nearest-neighbor classifier algorithm or a support vector machine algorithm.

A decision tree works differently than other classifiers, because not all features or characteristics are used simultaneously in the prediction of the class, but also in the modeling. Decisions are made successively as to which next feature is best suited to separate the data. This creates a hierarchy of rules for individual features, which can be visualized in the form of a tree.

The decision tree can represent models of high complexity; the interpretability remains very clear due to the hierarchical structure. With the help of ensemble methods, the performance can be increased by combining many different decision trees into a prediction unit, which compensates for wrong decisions of individual classifiers by others. As a result, the complexity that can be depicted is increased and traceability is lost. Two possible ensemble methods are the Random Forest and the Adaboost algorithm.

The K-Nearest Neighbor Classifier describes a relatively simple classification procedure based on similarities. A defined number k at the nearest neighbor is determined by means of a suitable distance measure. All the neighbors thus identified are assigned to a specific class. The class that predominates in this selection is selected and assigned to the new object to be classified.

The decision tree and the K-neighbor classifier are considered to be the most promising algorithms for classifying networks in cable sets, according to corresponding investigations.

However, the other algorithms mentioned above can also be used.

Logistic regression determines the class to which an object most likely belongs. The name already implies that a value is determined, in this case the probability that an observation belongs to a certain class. The highest probability then determines the assignment.

The support vector machine is related to the logistic regression and tries to separate the data of different classes by a hyperplane. This can be used as a boundary to classify new objects accordingly.

The Naive Bayes classifier is a probabilistic classification method based on the Bayes' theorem. The classifier is naive because it assumes that all variables are stochastically independent of each other. This means that the values of the individual features have no direct influence on each other.

In a further embodiment, a parameter optimization can be carried out for the first classification system. Additionally, or alternatively, a parameter optimization can also be carried out for the second classification system.

All of the above algorithms have different parameters that can be adjusted for each classification task to optimize the classification results. Adjusting these parameters is also called parameter optimization.

Two possibilities for parameter optimization are the so-called grid search approach and the so-called random search approach.

Grid Search sets a range for the parameters to be examined. The complete possible combinatorics are then examined to determine which combination is the best to solve the problem. Grid Search is particularly suitable if a few parameters with few characteristics have to be optimized and sufficient computing time is available.

Random Search offers the possibility to evaluate random combinations of parameter assignments that are in a specified range. This is particularly suitable if there are many different parameter dimensions and grid search is not possible due to the required computing time.

For example, the parameter optimization for a decision tree for OK/NOK testing of networks is explained herein as follows.

The following parameters must be optimized for the decision tree:

1. 'criterion' for the indication of the criterion which assesses the quality of the splits and based on which the decision is made which of the splits is best suited. The Gini index and entropy are implemented. Both of them are to be tested.

2. imin_samples_leaf specifies the number of objects in at least one sheet (class decision) in order for the split to be admissible.

This represents a termination criterion for the pruning of the decision tree.

In an example of a fully developed decision tree, end nodes can exist, some of which contain only one object. Thus, an overtraining can be assumed. For this reason, the parameter imin_samples_leaf mentioned above can be tested in a range from one to 20. Since the two parameters are only a few combinations, the concept of grid search should be applied.

For the two-class model, the first classification system for the OK/NOK classification, the prediction model can, for example, work most reliably with regard to the metric of the FScore (ß=3), for example, if the quality of the splits with the Gini-Index is calculated and the pruning is pronounced to a small extent. A low degree of pruning means that at least two objects must be in a sheet of the decision tree after the parameter optimization, so the parameter imin_samples_leaf has the value 2.

In the multiclass prediction model, i.e., the second classification system for error localization, shows that pruning has no positive influence, but entropy should be used instead of the Gini index. Furthermore, the differences in parameter optimization are not very large and overtraining does not play a major role. It has been shown that the more the pruning is pronounced, the worse the prediction gets. The pruning can therefore be minimized after the parameter optimization.

Furthermore, the parameter optimization for the K-nearest-neighbor classifier is shown as an example:

The following parameters must be optimized for the K-nearest-neighbor classifier:

1. 'n_neighbors': specifies the number of nearest neighbors used to classify the object. For example, all odd values between 3 and 15 can be tested.

2. 'p': specifies the power for the Minkowski metric: p=1 corresponds to the Manhatten distance, p=2 to the Euclidean distance. For example, all values from one to three can be tested.

3. 'weights': weight function indicating how the neighbors are weighted for decision making. Either all are weighted equally (specification/expression 'uniform') or the weight is calculated by the inverse of the distance (specification/expression 'distance'), so that closer neighbors have a greater influence on the result. Both options can be tested in the context of parameter optimization.

Due to the manageable number of possible combinations, Grid Search can also be used here. For example, for the two-class prediction model, the result can show that the number of neighbors to consider should not be chosen too high, since the prediction accuracy can decrease. For example, this parameter can be set to a value less than 11.

If the weighting of the neighbors determined for the prediction is made dependent on the distance, the effect described above can disappear and the prediction accuracy remains the same up to the maximum value of 15 for the number of neighbors to be considered. Also, the metric used to calculate the distance may not have any effect. For this reason, the K-neighbor classifier with five neighbors to be considered and the Euclidean distance can be used as a distance measure. Only the weighting of the neighbors can be made depending on the distance, which can increase the robustness of the forecast.

The parameter values mentioned here can be used for both the first classification system and the second classification system.

In a further embodiment, when training the first classification system, a predetermined proportion, in particular between 70% and 95%, of the preprocessed training measured values are used for the training of the first classification system and the varying proportion of the preprocessed training measured values are used for a verification of the training. Additionally, or alternatively, when training the second classification system, a predetermined proportion, in particular between 70% and 95%, of the preprocessed training values are used for the training of the first classification system and the remaining proportion of the preprocessed training measured values are used for a verification of the training.

By dividing the training measured values, it can be ensured that a sufficiently high amount of measured values is available for the review of the classification systems.

As already described, a program, computer program product or computer program with program code that is stored on a machine-readable medium or storage medium such as a semiconductor memory is also advantageous, can be stored in a hard disk memory or an optical memory and is used to carry out, implement and/or control the steps of the method according to one of the embodiments described above; in particular, if the computer program product or program is executed on a computer or device. A program can be understood as a computer program product.

BRIEF DESCRIPTION OF THE DRAWINGS

The following advantageous embodiments of the invention are explained below with reference to the accompanying figures. They show:

FIG. 1 is a flow chart of an embodiment of a method according to the present invention;

FIG. 2 a flow chart of a further embodiment of a method according to the present invention.

Figure 3:
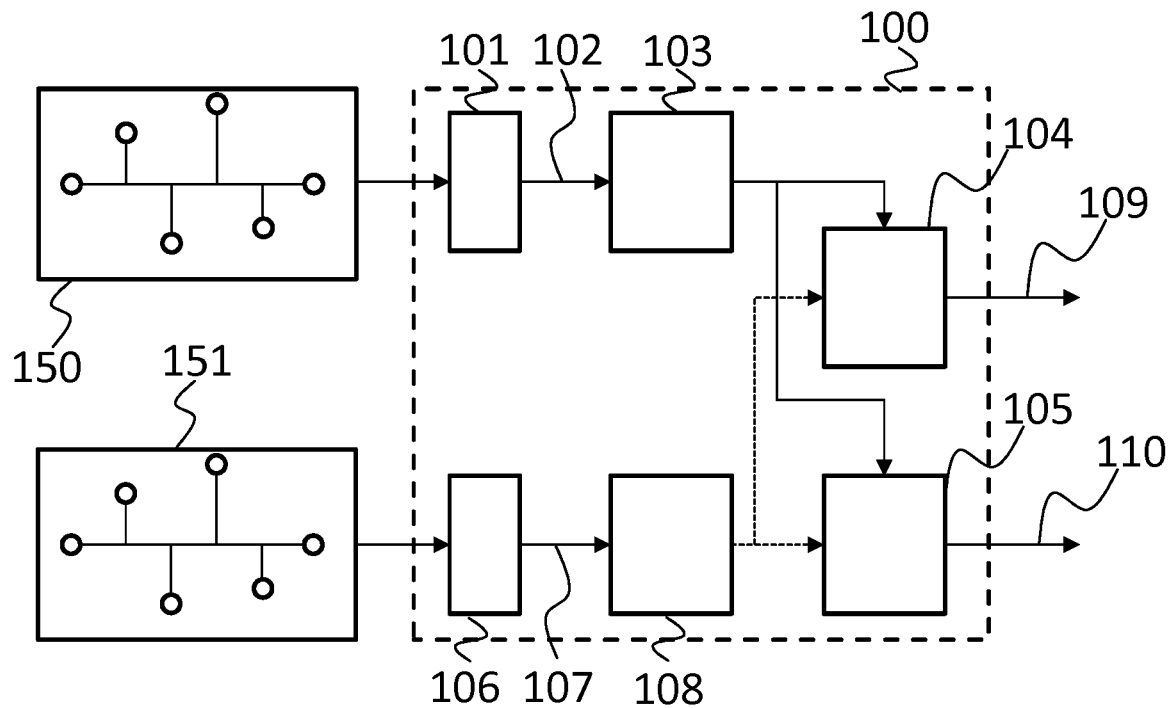
FIG. 3 is a block diagram of an embodiment of a test apparatus according to the present invention.

The figures are merely schematic representations and serve only to explain the invention. Elements that are the same or have the same effect are consistently identical provided with the same reference signs.

DETAILED DESCRIPTION OF THE INVENTION

For ease of understanding, in the following description of the figures as related to a method, the reference signs from the figures as relating to the apparatus are maintained.

FIG. 1 shows a flowchart of a method for testing a network 151, 360, 461 having a number of network sections A-I, J-Q. Such a network 151, 360, 461 may, for example, be part of a wiring harness for a vehicle having a plurality of such networks 151, 360, 461.

In a first step S1 of recording, training measured values 102 are recorded for a number of reference networks 150. Here, the reference networks 150 correspond to the network 151, 360, 461 to be tested. It is understood that the training measured values 102 may all be recorded at one reference network 150 or at different reference networks 150.

In a second step S2 of preprocessing, the recorded training measured values 102 are preprocessed to eliminate data errors in the training measured values 102.

In a third step S3 of the training, a first classification system 104, 204 is trained with the training measured values 102, wherein the first classification system 104, 204 is based on at least one algorithm from the field of machine learning and is trained to classify a network 151, 360, 461 as either fault-free or faulty.

In a fourth step S4 of training, a second classification system 105, 205 is trained with the training measured values 102, wherein the second classification system 105, 205 is based on at least one machine learning algorithm and is trained to classify a faulty network section A-I, J-Q of a network 151, 360, 461.

In a fifth step S5 of the recording, test measured values 107 are recorded for the network 151, 360, 461 respectively on or in the network to be tested.

In a sixth step S6 of preprocessing, the recorded test measured values 107 are preprocessed to eliminate data errors in the training measured values 102.

In a seventh step S7 of classification, the network 151, 360, 461 to be tested is classified as faulty-free or faulty on the basis of the recorded test measured values 107 using the trained first classification system 104, 204. Finally, in an eighth step S8 of the classification, the faulty network section A-I, J-Q of the network 151, 360, 461 to be tested is classified with the trained second classification system 105, 205 if the network to be tested 151, 360, 461 was classified as faulty by the trained first classification system 104, 204.

Thus, according to the invention, the classification result is generated in two steps. Using the first classification system 104, 204, step 7 checks whether the network 151, 360, 461 to be tested is faulty-free, OK, or not, NOK. Only for networks 151, 360, 461 that are not faulty-free, NOK, it is then determined by means of the second classification system 105, 205 in which network section the error is located. It is understood that this second classification may be skipped or omitted for networks 151, 360, 461 having only one network section.

It is understood that the first classification system 104, 204 and/or the second classification system 105, 205, may be based on, for example, a decision tree algorithm or an algorithm according to the ensemble method, in particular an AdaBoost algorithm, or an algorithm for logistic regression or a Naive Bayes classifier algorithm or a K-nearest-neighbor classifier algorithm or a support vector machine algorithm. Further algorithms from the field of machine learning, such as neural networks or the like, are also possible.

FIG. 2 shows a flowchart of a further method for testing a network 151, 360, 461 with a number of network sections A-I, J-Q. The method of FIG. 2 is based on the method of FIG. 1, but in the method of FIG. 2, in particular, the steps S1, S2 and S6 explained above are carried out in more detail.

In step S1, training measured values 102 can be recorded on one or more faulty-free reference networks 150 in the sub-step S11 of the recording. Faulty-free means that for the reference networks 150 it is ensured that they do not have any error influencing the measurement. This can be ensured, for example, by prior checks on the reference networks 150. It is understood that the measurements for the one-time verification of a reference network 150 can be more complex than the later measurements on the networks 151, 360, 461 to be tested, for example in the series production of wiring harnesses.

In order to train the first classification system 104, 204 or the second classification system 105, 205, training data for failure cases or for errors in individual network sections of the networks to be tested 151, 360, 461, a further sub-step may be provided. In the recording sub-step S12, measured values can be recorded or measured at reference networks 150 in which faults have been generated at predetermined network sections A-I, J-Q. In particular, faults can be generated successively at all network sections and corresponding measurements and recordings can be carried out. To generate the faults in the corresponding network sections A-I, J-Q, for example, the dielectric constant can be changed by a corresponding line of the respective network 151, 360, 461.

In step S2 of the preprocessing, outliers can be detected and eliminated in the recorded training measured values 102 further on in a sub-step S21 of the elimination. Identifying outliers may involve identifying local outliers or global outliers and treating them accordingly. For example, outliers can be detected using the 2-sigma rule or the Grubbs and Hampel outlier test or using local outlier factor algorithm.

Furthermore, in step S2 of the preprocessing, offset errors can also be detected and eliminated in the recorded training measured values 102 in the sub step S22 of the recognition and elimination. For example, to detect and eliminate offset errors, the recorded training measured values 102 may be converted to differential measured values.

Finally, step S2 of preprocessing may comprise the sub-step S23 of the aggregating. A plurality, in particular 2, 4, 8, 16, 32 or 64, of individual measurement curves can be aggregated in the sub-step S23.

The step S6 of preprocessing has, in the sub-step S61 of detecting and eliminating, detecting and eliminating outliers in the recorded test measured values 107. The detecting of outliers may comprise detecting and handling local outliers or global outliers. For this purpose, algorithms according to the 2-sigma rule or the outlier test according to Grubbs and Hampel or the local outlier factor algorithm can be used, for example.

The step S6 of the preprocessing may further comprise the sub-step S62, in which offset errors are detected and eliminated in the recorded test measured values 107. For detecting and eliminating offset errors, the recorded test measured values 107 may be converted, for example, into differential measured values. It is understood that in this case explicit recognition need not be carried out, and the offset correction is automatically carried out by the conversion into differential measured values.

Finally, step S6 of the preprocessing may have the sub-step S63 of the aggregation. In this step S63, a plurality, in particular 2, 4, 8, 16, 32 or 64, of individual measurement curves can be aggregated.

FIG. 3 shows a block diagram of a test apparatus 100 for testing a network 151 with a number of network sections. For example, such a network 151 may be part of a line set with a number of such networks 151.

The test apparatus 100 comprises a first data acquisition device 101 coupled to a computing device 103. The computing device 103 is coupled to a first classification system 104 and a second classification system 105. Further, the test apparatus 100 comprises a second data acquisition device 106 coupled to a test control device 108. The test control device 108 is also coupled to the first classification system 104 and to the second classification system 105.

The first data acquisition device 101 records training measured values 102 for a number of reference networks 150 during operation. The reference networks 150 correspond to the network 151 to be tested. The computing device 103 processes the recorded training measured values 102 and eliminates from these data errors, which would have a negative influence on the recognition quality of the fault detection in network 151 in the further course.

The first classification system 104 is based on at least one algorithm from the field of machine learning and is designed to classify a network 151 as either faulty-free or faulty. The second classification system 105 is based on at least one algorithm from the field of machine learning and is designed to classify a faulty network section of a network 151. The computing device 103 uses the acquired training measured values 102 to train the first classification system 104 with these, and to train the second classification system 105 with these.

After the training, the first classification system 104 is therefore trained to divide networks 151 into faulty-free, OK, and non-faulty-free, NOK, networks based on measurement data. The second classification system 105, on the other hand, is able to identify the corresponding network section which shows the error in faulty networks after the training.

The second data acquisition device 106 acquires test measurements 107 in, for and/or on the network 151 to be tested and transmits them to the test control device 108. The test control device 108 also performs preprocessing on the acquired test measured values 107 to eliminate data errors in the training measured values 102.

Further, the test control device 108 classifies the network 151 to be tested as faulty-free or faulty based on the recorded test measured values 107 using the trained first classification system 104. For example, the classification result 109 may be output to a user for documentation or information. If a network 151 has been identified as faulty, the test control device 108 classifies the faulty network section of the network 151 to be tested using the trained second classification system 105.

Figure 4:
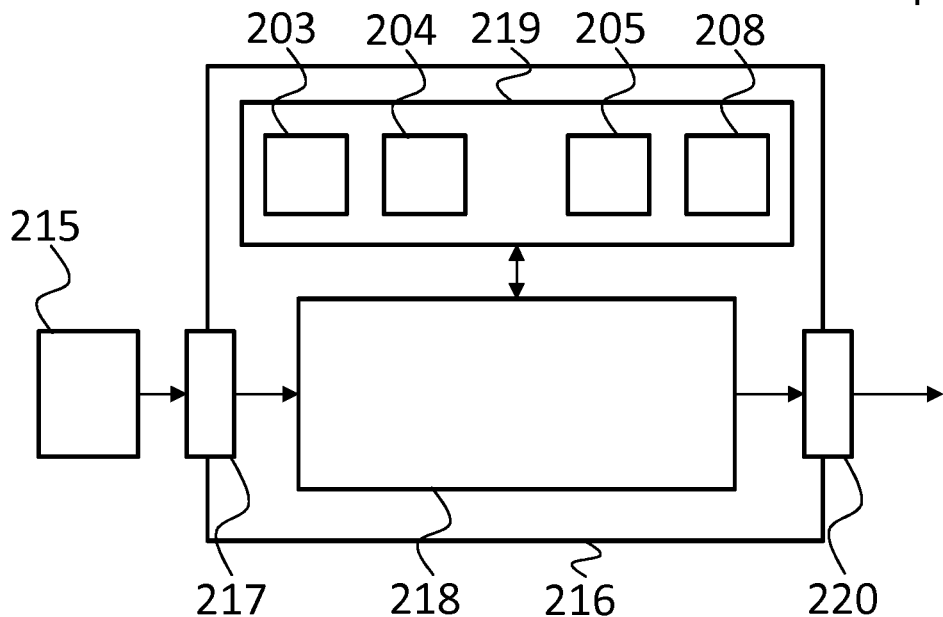
FIG. 4 is a block diagram of a further embodiment of a test apparatus according to the present invention.

FIG. 4 shows a block diagram of another test device 200. The test device 200 is based on the test apparatus 100. Consequently, the test device 200 comprises a data acquisition device 215 coupled to a computing unit 218 via a data interface 217 of a control device 216. The computing unit 218 may be, for example, a processor of a computer and is coupled to a memory 219. The memory stores program instructions or commands 203, 204, 205, 208 that form programs mapping the function of the computing device 103, the first classification system 104, the second classification system 105, and the test control device 208. In the testing device 200, the computing device 203, the first classification system 204, the second classification system 205, and the testing control device, which have been described above as separate entities, are therefore implemented in a program-based manner.

The control device 216 may be implemented, for example, as a control computer having the corresponding data interface 217 and an output interface 220. The data acquisition device 215 replaces the first data acquisition device 101 and the second data acquisition device 106 in the exemplary test apparatus 200. Both the training measured values and the test measured values are recorded with the data acquisition device 215.

It is understood that in further embodiments of the testing apparatus 100, 200 at least some of the elements of the testing devices 100, 200 described above may be implemented as software or computer program product, which are executed by a processor or computing device. It is further understood that the individual elements of the testing devices 100, 200 may be further developed analogously to the training of the corresponding process steps described above.

For example, the computing device 103, 203 may be designed to record measured values at fault-free reference networks 150 when recording training measured values 102, and/or to record measured values at reference networks 150 in which faults have been generated at predetermined network sections A-I, J-Q. For this purpose, for example, the dielectric constant can be changed in the corresponding network sections A-I, J-Q by a corresponding line of the respective network 151, 360, 461. Furthermore, the computing device 103, 203 may be designed to detect and eliminate outliers, in particular local outliers or global outliers, in the recorded training measured values 102 during preprocessing of the recorded training measured values 102. For this purpose, for example, the 2-sigma rule or the outlier test according to Grubbs and Hampel or the local outlier factor algorithm may be used. The computing device 103, 203 may further be designed to detect and eliminate offset errors in the recorded training measured values (102) during preprocessing of the recorded training measured values (102). For this purpose, the recorded training measured values 102 may be converted, for example, into differential measured values. The computing device 103, 203 may also be designed to aggregate a plurality, in particular 2, 4, 8, 16, 32 or 64, of individual measurement curves in each case when preprocessing the recorded training measured values 102.

The test control device 108, 208 can be designed, for example, to detect and eliminate outliers, in particular local outliers or global outliers, in the recorded test measured values 107 during preprocessing of the recorded test measured values 107. The 2-sigma rule or the Grubbs and Hampel outlier test or the local outlier factor algorithm may be used for this purpose. The test control device 108, 208 may be further designed to detect and eliminate offset errors in the recorded test measured values 107 during preprocessing of the recorded test measured values 107. The recorded test measured values 107 may be converted to differential measurement values for this purpose, for example. The test control device 108, 208 may further also be designed to aggregate a plurality, in particular 2, 4, 8, 16, 32 or 64, of individual measurement curves in each case during preprocessing of the recorded test measured values 107.

Figure 5:
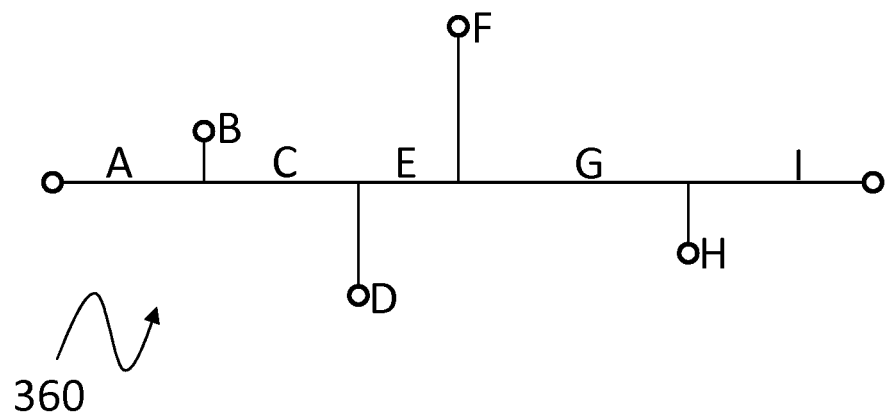
FIG. 5 is an example of a possible network for use with the present invention.

FIG. 5 shows a network 360 for use with the present invention. The network 360 has a bus structure. It therefore consists of a continuous main line to which stub lines are provided at predetermined points for contacting bus subscribers. Such a network can, for example, form the basis of a CAN bus or a FlexRay bus in a vehicle.

In the network 360, the individual segments or network sections A-I are each identified by a letter, with the network sections A, C, E, G and I forming the central main line and the network sections B, D, F, H each designating a stub line.

Impedance changes in such a network 360 can be caused in particular, for example, by the connection of the spur lines and also by faults in the individual lines of the network 360.

The recording of the training data forms a kind of "fingerprint" for the network 360. Consequently, the present invention makes it possible to identify as faulty only networks in which impedance changes are actually caused by faults. The fact that this is not possible with the naked eye becomes clear in FIG. 7, where a measurement curve is shown for a network such as can be used with the present invention.

Figure 6:
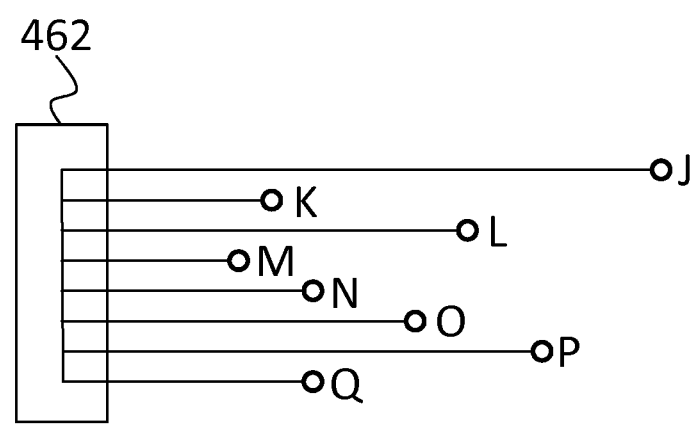
FIG. 6 is an example of another possible network for use with the present invention.
Figure 6:
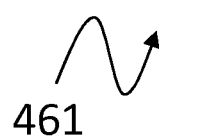

FIG. 6 shows another network 461 for use with the present invention. The network 461 includes a star coupler 462. The star coupler 462 forms the central element or central distributor of the network 461. In such a network 461, there are no stub lines. Rather, all network sections J-Q are connected to the central star coupler 462. Consequently, all lines or network sections J-Q converge in the star coupler 462.

Such a network 461 can, for example, also form the basis for a CAN bus network or a FlexRay network in a vehicle. The individual bus nodes are then connected at the ends of the individual network sections J-Q.

Figure 7:
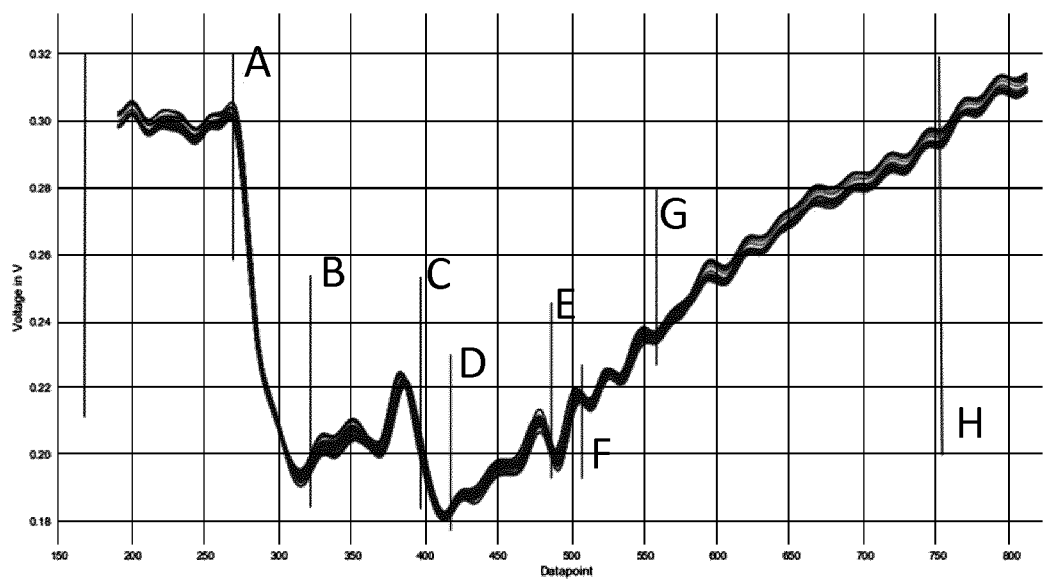
FIG. 7 a diagram of a measurement on an electrical network.

FIG. 7 shows a diagram of a measurement on an electrical network 461.

It can be seen that in the measurement curve, at least the first movements of the amplitudes (indicated by vertical lines) are still reasonably comprehensible. Basically, when the signal reaches the star coupler 462, a decrease of the amplitude is to be expected due to distribution of the signal into all branches (A). Likewise, a subsequent increase of the amplitudes can be expected due to the different lengths of the individual network segments J-Q. However, all other patterns can no longer be interpreted. In particular, due to the multiple overlaps, no faults in the network can be identified optically by a user via the measurement curve. The identification of faults in the respective network, on the other hand, can be performed reliably with the aid of the present invention.

Since the devices and methods described in detail above are examples of embodiments, they can be modified in a customary manner to a large extent by the person skilled without leaving the scope of the invention. In particular, the mechanical arrangements and the proportions of the individual elements to each other are merely exemplary.

LIST OF REFERENCES 100, 200 test device/apparatus
101 first data acquisition device
102 training measured values
103, 203 computing device
104, 204 first classification system
105, 205 second classification system
106 second data acquisition device
107 test measured values
108, 208 test control device
109 first classification result
110 second classification result
215 data acquisition device
216 control device
217 data interface
218 computing unit
219 memory
220 Output interface
150 Reference network
151 Network
360 network
461 network
462 Star node
A-I, J-Q Network section
S1-S8, S11, S12, S21 Process step
S22, S23, S61, S62, S63 Process step

The invention claimed is:

1. A method for testing a network comprising a number of network sections or a line set comprising a number of such networks, the method comprising the steps of:
recording training measured values for a number of reference networks, the reference networks corresponding to the network to be tested,
preprocessing the recorded training measured values to eliminate data errors in the training measured values,
training a first classification system with the training measured values, the first classification system being based on at least one algorithm from the field of machine learning and designed to form a network either to be classified as faulty-free or faulty,
training a second classification system with the training measured values, the second classification system being based on at least one algorithm from a field of machine learning and being designed to identify a faulty network section of a network,
recording test measured values for the network to be tested,
preprocessing the recorded test measured values in order to eliminate data errors in the training measured values,
classifying the network to be tested as faulty-free or faulty on the basis of the recorded test measured values with the trained first classification system, and
classifying the faulty network section of the network to be tested with the trained second classification system if the network to be tested has been classified as faulty by the trained first classification system.

2. The method according to claim 1;
wherein the recording of training measured values comprises the recording of measured values on faulty-free reference networks, and
wherein the recording of training measured values comprises the recording of measured values on reference networks in which errors were generated at predetermined network sections.

3. The method according to claim 2, wherein, in order to generate the errors in the corresponding network sections, the dielectric constant is changed by a corresponding line of the respective network.

4. The method according to claim 1, wherein:
the preprocessing of the recorded training measured values comprises recognizing and eliminating outliers in the recorded training measured values, and/or
the preprocessing of the recorded test measured values comprises recognizing and eliminating outliers in the recorded test measured values.

5. The method according to claim 4, wherein the detection of outliers comprises recognizing and treating local outliers or global outliers.

6. The method according to claim 4, wherein the recognition of outliers is carried out by means of the 2-sigma rule or by means of an outlier test according to Grubbs and Hampel or by means of a local outlier factor algorithm.

7. The method according to claim 1, wherein:
the preprocessing of the recorded training measured values comprises detecting and eliminating offset errors in the recorded training measured values, and/or
preprocessing of the recorded test measured values comprises detecting and eliminating offset errors in the recorded test measured values.

8. Method according to claim 7, wherein:
the detection and elimination of offset errors comprises converting the recorded training measured values into differential measured values, and/or
wherein the detecting and eliminating of offset errors comprises converting the recorded test measured values into differential measured values.

9. The method according to claim 1, wherein:
the preprocessing of the recorded training measured values comprises aggregating a plurality, 2, 4, 8, 16, 32 or 64 individual measurement curves and/or
the preprocessing of the recorded test measured values comprises aggregating in each case a plurality, 2, 4, 8, 16, 32 or 64 individual measurement curves.

10. The method according to claim 1, wherein:
the first classification system is based on at least one of a decision tree algorithm, an algorithm according to the ensemble method, an AdaBoost algorithm, an algorithm for logistic regression, a Naive Bayes classifier algorithm, a K-nearest-neighbor classifier algorithm or a support vector machine algorithm based, and/or
the second classification system based on at least one of a decision tree algorithm, an algorithm according to the ensemble method, an AdaBoost algorithm, an algorithm for logistic regression, a Naive Bayes classifier algorithm, a K-nearest-neighbor classifier algorithm or a support vector machine algorithm based.

11. The method according to claim 10, wherein:
for the first classification system a parameter optimization is performed, and/or
a parameter optimization is carried out for the second classification system.

12. The method according to claim 1, wherein:
during training the first classification system, at least one of a predetermined proportion or between 70% and 95% of the preprocessed training measured values is used for training the first classification system, and the remaining proportion of the preprocessed training measured values is used for verification of the training, and/or
wherein, during training of the second classification system, at least one of a predetermined proportion or between 70% and 95% of the preprocessed training measured values is used for training the first classification system and the remaining proportion of the preprocessed training measured values is used for verification of the training.

13. A testing apparatus for testing a network having a number of network sections or in a line set having a number of such networks, comprising:
a first data acquisition device configured to record training measured values for a number of reference networks, wherein the reference networks correspond to the network to be tested,
a computing device configured to preprocess the recorded training measured values in order to eliminate data errors in the training measured values,
a first classification system based on at least one algorithm from the field of machine learning and designed to classify a network as either faulty-free or faulty,
wherein the computing device is further configured to train the first classification system with the training measured values,
a second classification system based on at least one algorithm from the field of machine learning and designed to classify a faulty network section of a network,
wherein the computing device is further configured to train the second classification system with the training measured values,
second data acquisition device which is designed to record test measured values for the network to be tested, and
a test control device configured to preprocess the recorded test measured values in order to eliminate data errors in the training measured values,
wherein the test control device is further configured to classify the network ti be tested as faulty-free or faulty on the basis of the recorded test measured values with the trained first classification system, and
wherein the test control device is further configured to classify the faulty network section of the network to be tested with the trained second classification system if the network to be tested has been classified as faulty by the trained first classification system.

14. The test apparatus according to claim 13, wherein
the computing device is configured to record measured values on faulty-free reference networks when recording training measured values, and/or
the computing device being designed to record training measured values, on reference networks when recording training measured values, in which faults have been generated at predetermined network sections, in order to generate the faults in the corresponding network sections, and the dielectric constant being changed by a corresponding line of the respective network (151, 360, 461) and/or
the computing device is configured to detect and eliminate outliers, local outliers or global outliers in the preprocessing of the recorded training measured values in the recorded training measured values, by means of the 2-sigmar rule, by means of an outlier test according to Grubbs and Hempel, or by means of a local outlier factor algorithm, and/or
the computing device is configured to detect and eliminate offset errors in the recorded training measured values during preprocessing of the recorded training measured values or by converting the recorded training measured values into differential measured values, and/or
the computing device is configured to aggregate a plurality, 2, 4, 8, 16, 32 or 64 individual measurement curves in each case when preprocessing the recorded training measured values, and/or
wherein the first classification system is based on a decision tree algorithm or an algorithm according to the ensemble method, an AdaBoost algorithm, or an algorithm for logistic regression or a Naive Bayes classifier algorithm or a K-nearest neighbor classifier algorithm or a support vector machine algorithm, and
wherein the computing device is configured to perform parameter optimization for the first classification system.

15. The test apparatus according to claim 13, wherein:
the test control device is configured to detect and eliminate outliers, local outliers or global outliers during the preprocessing of the recorded test measured values in the recorded test measured values, by means of the 2-Sigma rule or by Grubbs and Hampel outlier test or by local outlier factor algorithm, and/or
wherein the test control device is configured to detect and eliminate offset errors in the recorded test measured values when preprocessing the recorded test measured values by the recorded test measured values into differential measured values, and/or wherein the test control device is configured to aggregate a plurality, 2, 4, 8, 16, 32 or 64 of individual measurement curves when the recorded test measured values are preprocessed, and/or wherein the second classification system is based on a decision tree algorithm or an algorithm according to the ensemble method, an AdaBoost algorithm, or an algorithm for logistic regression or a Naive Bayes classifier algorithm or a K-nearest-neighbor classifier algorithm or a support vector machine algorithm, wherein the test control device is configured to optimize the parameters for the second classification system (105, 205).

\* \* \* \* \*